United States Patent [19]
Oppermann et al.

[11] Patent Number: 6,093,971
[45] Date of Patent: Jul. 25, 2000

[54] CHIP MODULE WITH CONDUCTOR PATHS ON THE CHIP BONDING SIDE OF A CHIP CARRIER

[75] Inventors: Hans-Hermann Oppermann, Berlin; Elke Zakel, Falkensee; Ghassem Azdasht; Paul Kasulke, both of Berlin, all of Germany

[73] Assignee: Fraunhofer-Gesellschaft zur Forderung der Angewandten Forschung e.V., Munich, Germany

[21] Appl. No.: 08/850,547

[22] Filed: May 2, 1997

[30] Foreign Application Priority Data

Oct. 14, 1996 [DE] Germany .......................... 196 42 358
Jan. 22, 1997 [DE] Germany .......................... 197 02 014

[51] Int. Cl.$^7$ .......................... H01L 23/48; H01L 23/52; H01L 29/40
[52] U.S. Cl. .......................... 257/783; 257/782; 257/780; 257/781
[58] Field of Search .......................... 257/668, 778, 257/688, 780, 781, 700, 776, 784, 786, 782, 783

[56] References Cited

U.S. PATENT DOCUMENTS

| | | | |
|---|---|---|---|
| 4,246,595 | 1/1981 | Noyori et al. .......................... | 257/668 |
| 4,783,695 | 11/1988 | Eichelberger et al. .......................... | 257/668 |
| 4,933,042 | 6/1990 | Eichelberger et al. . | |
| 5,148,266 | 9/1992 | Khandros et al. . | |
| 5,289,346 | 2/1994 | Carey et al. . | |
| 5,293,067 | 3/1994 | Thompson et al. .......................... | 257/668 |
| 5,305,944 | 4/1994 | Yoshida et al. . | |
| 5,350,947 | 9/1994 | Takekawa et al. . | |
| 5,363,277 | 11/1994 | Tanaka . | |
| 5,367,763 | 11/1994 | Lam . | |
| 5,489,804 | 2/1996 | Pasch . | |
| 5,528,075 | 6/1996 | Burns . | |
| 5,841,194 | 11/1998 | Tsukamoto .......................... | 257/668 |

FOREIGN PATENT DOCUMENTS

| | | |
|---|---|---|
| 0 582 052 | 2/1994 | European Pat. Off. . |
| 0 683 513 | 11/1995 | European Pat. Off. . |
| 0 702 404 | 3/1996 | European Pat. Off. . |
| 0 704 898 A2 | 4/1996 | European Pat. Off. . |
| 40 10 644 A1 | 8/1991 | Germany . |
| 195 00 655 A1 | 7/1996 | Germany . |
| 195 07 547 A1 | 9/1996 | Germany . |

OTHER PUBLICATIONS

Hilmar Beine, Ball Grid Arrays, Die Fachzeitschnft fur Elektronik–Fertigung und Test, productronic 3—1995, pp. 26–33.

Mike C. Loo et al., Area Array Chip Carrier: SMT Package for Known Good Die, ISHM '93 Proceedings, 318–329.

Heitmann R: "The Ultimate Connections: BGA and Flip Chip Attachment" Electronic Packaging and Production, vol. 36, No. 5, May 1, 1996, pp. 68–70, 72, 74–76, XP000589071 see p. 69–72; figures 2, 4.

*Primary Examiner*—Sheila V. Clark
*Attorney, Agent, or Firm*—Darby & Darby

[57] ABSTRACT

Chip module (20) with a chip carrier (21) and at least one chip (22), wherein the chip carrier is designed as a sheet with a carrier layer (23) of plastics material and a conductor path structure (24) with conductor paths (28), and the chip carrier is connected to the chip with interposition of a filling material (37), wherein the conductor paths are connected on their front to attachment faces (32) of the chip and, on their rear side (27), have external bonding regions (26) for forming a flatly distributed attachment face arrangement (34) for the connection of the chip module to an electronic component or a substrate (31), and the conductor paths (28) extend in a plane on the chip bonding side (35) of the carrier layer (23) facing the chip (22), the external bonding regions (26) are formed by recesses in the carrier layer (23) which extend toward the rear side (27) of the conductor paths (28) and the carrier layer (23) extends over the region of the attachment faces (30) of the chip.

11 Claims, 12 Drawing Sheets

FIG 20

CHIP MODULE WITH CONDUCTOR PATHS ON THE CHIP BONDING SIDE OF A CHIP CARRIER

BACKGROUND OF THE INVENTION

1. Field of the Invention

The present invention relates to a chip module with a chip carrier and at least one chip, wherein the chip carrier is designed as a sheet with a carrier layer of plastics material and a conductor path structure with conductor paths, and the chip carrier is connected to the chip with interposition of a filling material, wherein the conductor paths are connected on their front to attachment faces of the chip and have, on their rear, external bonding regions for forming a flatly distributed attachment face arrangement for connection of the chip module to an electronic component or a substrate. The invention also relates to a process for producing such a chip module.

Chip modules of the above-mentioned type are used, for example, to allow a flatly distributed less dense attachment face arrangement for connecting the chip to a board or the like by conventional SMT (surface mounted technology) starting from the very dense peripheral attachment face arrangement of a chip via the chip carrier provided with a conductor path structure. Sufficiently great spacing between the individual attachment faces of the attachment face arrangement has proven particularly important, in particular, because the external attachment face arrangement is generally connected to the board or the like by a reflow process. If the space between the individual attachment faces is too small, short-circuit connections between individual solder bumps of the attachment face arrangement can arise.

Owing to the increasing demand for miniaturisation of chip modules, chip modules described as "CSP" (chip size package or also chip scale package) have been developed on the basis of so-called "BGA" (ball grid array) attachment face distributions. In contrast to the above-mentioned BGAs in which the flat redistribution of the chip attachment faces over a surface area which is substantially greater than the chip surface is effected by means of correspondingly great chip carriers, an area which substantially coincides with the surface of the chip is available for the chip carrier in the chip modules designated by CSP. It has therefore proven important with the CSPs to utilise the available area as well as possible.

2. Description of the Related Art

In known CSPs, of the type known, for example, from U.S. Pat. No. 5,367,763 or from "Proceedings of the 1993 International Symposium on Microelectronics (ISHM), Dallas, Tex., pages 318–323", the edge region of the area available for the chip carrier and congruent with the surface, for the attachment connections between the attachment faces of the chip and the conductor path structure of the chip carrier is used up so the chip carrier extends only in an internal surface region reduced by the edge region. It is therefore necessary with chip modules of this design to provide the periphery of the chip surface with a separate covering, for example a casting compound, in a subsequent stage of operation in order to achieve a complete housing which also covers the attachment faces of the chip in an insulating manner.

It is accordingly the object of the present invention to propose a chip module and a process for producing a chip module which allow better utilisation of the chip surface available for the arrangement of the chip carrier, the construction of the chip module at the same time being as simple as possible.

SUMMARY OF THE INVENTION

This object is achieved with a chip module according to the invention, wherein the conductor paths extend in a plane on the chip bonding side of the carrier layer facing the chip. The carrier layer itself is therefore available for the mutually insulated arrangement of the redistributed attachment faces, so the external bonding regions for forming the flatly distributed attachment face arrangement can be formed by recesses in the carrier layer extending toward the rear of the conductor path. The carrier layer also extends over the region of the attachment faces of the chip in the chip module according to the invention so the entire chip surface is covered by the carrier layer of the chip carrier. Overall, this results in a very simple construction and correspondingly simple production of the chip module.

In a first embodiment of the chip module according to the invention, the carrier layer of the chip carrier is closed in the overlap region with the attachment faces of the chip so even this overlap region in the peripheral region of the chip carrier surface is available for the arrangement of external attachment faces on the chip carrier surface.

In a further embodiment of the chip module according to the invention, the chip carrier has a carrier layer having orifices in an overlap region with the attachment faces of the chip which extend toward the rear of the conductor paths and serve to receive connecting material electrically connecting the conductor paths to the associated attachment faces.

This embodiment of the chip module allows production during which both the recesses in the carrier layer provided for receiving connecting material for the bonding of the chip module with a board or other components and the orifices in the carrier layer can be filled with connecting material in one and the same step of the process.

The design of the chip module according to claim 4 makes the chip attachment faces readily accessible for the connecting material so high reliability of bonding is guaranteed.

If sealing or mechanical stabilisation of the assembly of chip and chip carrier is not sufficient owing to the filling material arranged between the chip and the chip carrier, a supporting frame preferably formed from the filling material can be provided along the periphery of the chip for completion. Effective mechanical stabilisation of the chip module is thus achieved in each case without the dimensions of the chip module predetermined by the chip having to be significantly increased for this purpose.

Alternatively to the above-mentioned possibility, however, it is also possible to provide sealing or mechanical stabilisation of the chip module by a casting compound of the chip which connects the lateral faces of the chip with a projection of the chip carrier projecting beyond the chip surface. This type of sealing or mechanical stabilisation of the chip module is particularly advantageous if a chip module is to be produced in the form of a chip size package in which the chip carrier surface is somewhat greater than the chip surface so the chip module has a projection of the chip carrier.

For fitting the chip module on a substrate or a board by known SMT technology, during which the external bonding regions arranged on the chip carrier surface and provided, for example, with solder material are connected to correspondingly arranged counter-bonds on the carrier layer or the board, it has proven advantageous if the external bonding regions of the chip carrier surface are provided with solder material of which the melting point is lower than the temperature required for the thermal connection between the contact metallizations of the chip and the conductor paths of the chip carrier. This ensures that the connections between the contact metallizations of the chip and the conductor paths of the chip carrier cannot be destabilised owing to the temperature loading of the chip module for producing the soldered connection between the chip carrier and the substrate or the board.

It has proven particularly advantageous for production of chip modules if the chip modules are combined according to the invention in a module assembly formed from a chip carrier assembly with a plurality of coherently formed chip carriers and a chip assembly, in particular a wafer with a plurality of coherently formed chip units or dies.

When carrying out the process according to the invention for producing chip modules, a flowing filling material is initially applied to the chip surface or the chip bonding side of the chip carrier. This filling material serves, on the one hand, for the sealed arrangement of the chip carrier on the chip and, on the other hand, for the mechanical stabilisation of the chip carrier on the chip. The filling material can also have adhesive properties for forming a flat assembly between the chip and the chip carrier. The filling material is distributed in the gap between the chip bonding side of the chip carrier and the chip surface by pressing the chip carrier and the chip together. Owing to the bonding of the conductor paths and the associated contact metallizations of the chip by a backward energy loading of the conductor paths with interposition of the carrier layer, the surface of the carrier layer of the chip carrier remains closed even during bonding so the filling material can only be displaced to the side. This ensures that the filling material covers the entire chip surface and no additional measures are required to make up filling material after production of the connection between the chip carrier and the chip. Rather, bonding of the chip carrier on the chip and stabilisation of the chip module are effected by distribution of a filling material in the gap between the chip carrier and the chip in a single operation.

An alternative process according to the invention is disclosed in which a chip carrier already provided with an adhesive layer is used instead of the application of filling material.

Furthermore, owing to the above-mentioned backward energy loading of the conductor paths for the bonding of the chip carrier on the chip and the resultant enclosure of the carrier layer of the chip carrier even in the peripheral region of the chip, it is possible to provide external bonding regions for forming the flatly distributed attachment face arrangement on the chip carrier surface.

An alternative to the above-described process according to the invention for producing individual chip modules is provided which relates to the production of individual chip modules according to the invention by isolation from a module assembly in which a plurality of chip modules formed according to the invention are formed coherently. For this purpose, the module assembly is initially produced with a chip carrier assembly and a chip assembly according to claim 8, and a plurality of individual chip modules is then produced by isolating units consisting of at least one chip and one chip carrier bonded therewith from the module assembly.

This process according to the invention therefore allows the production of chip modules on the wafer plane permitting not only the production of an individual chip module but rather the simultaneous production of a plurality of chip modules with relatively few handling or production steps.

It has proven particularly advantageous if the subsequent sequence of production steps is observed for producing the module assembly:

Firstly, there is effected the preparation of a wafer provided with raised contact metallizations, also known as so-called "bumps" in specialist jargon, and the preparation of a chip carrier assembly having a plurality of conductor path structures with conductor paths arranged on a common carrier layer, wherein the conductor path structures are allocated a respectively defined number of chips formed coherently in the wafer. A flowing filling material is then applied to the bonding face of the wafer or the chip bonding side of the chip carrier assembly, and this filling material can be, for example, an epoxy resin adhesive. Application of the filling material to the wafer can be effected as a flatly limited application in the centre of the wafer followed by distribution of the filling material over the wafer surface by rotation of the wafer round its centre axis. Before flat connection of the chip carrier assembly to the wafer, which can be achieved, for example, by a laminating process, relative positioning of the wafer and of the chip carrier assembly is effected so as to adjust an overlap position between the contact metallizations of the wafer and bonding regions of the associated conductor paths of the conductor path structures. The flat connection between the wafer and the chip carrier assembly is finally produced, for example by the above-mentioned laminating process, and the final connection can be preceded by preliminary fixing at selected points. Bonding of the contact metallizations of the wafer with the associated conductor paths of the chip carrier assembly takes place after production of the flat connection or simultaneously therewith.

With an alternate procedure a chip carrier assembly already provided with an adhesive layer is used instead of the application of filling material.

As already mentioned hereinbefore in connection with the process according to the invention for producing an individual chip module, the bonding of the contact metallizations of the wafer with the conductor paths of the chip carrier assembly by the carrier layer of the chip carrier assembly can also be effected during production of the entire module assembly, for example by backward bonding without disturbing the carrier layer in the region of the bonding points.

As an aid to relative positioning, the wafer can be provided with at least two positioning pins which engage in correspondingly formed positioning orifices in the carrier layer of the chip carrier assembly. Such positioning pins can be designed as "dummy bumps" which, without participating in the electrical connection between the wafer and the chip carrier assembly, merely engage in the carrier layer of the chip carrier assembly for the achievement and mechanical stabilisation of the relative positions. In order to define not only a rigid body orientation between the wafer and the chip carrier assembly, it may prove beneficial to provide more than two positioning pins and the corresponding number of positioning orifices, so expansion limits for, for example, thermally induced expansions in the carrier layer are created.

An alternative advantageous procedure for producing a module assembly is defined by the following process steps:

Firstly there is again prepared a wafer and a chip carrier assembly with a plurality of conductor path structures with conductor paths arranged on a common carrier layer, a chip carrier assembly with a carrier layer having orifices which expose the rear of the chip bonding region of the conductor paths and optionally adjoining ambient regions being used in this variation. A flowing filling material which, as in the above-described variation, can be designed as an epoxy resin adhesive is then applied to the bonding surface of the wafer or the chip bonding side of the chip carrier assembly such that the attachment faces of the wafer or contact metallizations applied thereto and the orifices of the carrier layer are exposed. Relative positioning of the wafer and of the chip carrier assembly then takes place so that an overlap position is adjusted between the attachment faces of the wafer and contact metallizations constructed thereon and the orifices in the carrier layer of the chip carrier assembly. Then a flat connection is made between the wafer and the chip carrier assembly and bonding of the attachment faces of the wafer and of the contact metallizations arranged thereon with the chip bonding regions of the associated conductor paths is effected by introduction of connecting material into the orifices in the carrier layer of the chip carrier assembly.

The above-described variation allows the production of chip modules according to the invention described at the outset in which both the connecting material deposits in the recesses of the carrier layer which serve for the bonding of the chip module with other components, and the connecting material in the orifices in the carrier layer for allowing bonding between the conductor paths of the conductor path structure and the chip attachment faces can be introduced in one operation.

Bonding can be effected by depositing connecting material in the orifices in the carrier layer, a current-free, that is autocatalytic deposition of connecting material by introduction of the module assembly into a corresponding bath of material having proven particularly advantageous in experiments. This bath of material can be, for example, a bath of nickel, copper or palladium.

Bonding can also be effected by introduction of solder material or conductive adhesive into the orifices in the carrier layer, and any known methods of introducing solder material, for example template soldering or also introduction of lumped solder material can be employed.

Simultaneously with introduction of the connecting material into the bonding orifices in the carrier layer, connecting material can be introduced into the recesses in the carrier layer.

Independently of the method of producing the module assembly, it has proven advantageous if the wafer is provided on its rear with a surface layer which can be used as surface protection and also for achieving a mechanical supporting effect. Together with the carrier layer of the chip carrier assembly, an encapsulated chip module is therefore produced after isolation of the chip modules from the module assembly.

An application of epoxy resin material to the rear of the wafer has proven useful for producing this surface layer. A further method of forming the surface layer involves applying a sheet to the rear of the wafer. The sheet can be provided with an inscription, for example for identifying individual chips of the wafer.

Independently of the method of producing the module assembly, chip modules are isolated from the module assembly by separating mutually adjacent chip modules along defined parting lines after production thereof. It has proven particularly advantageous in this connection if the sawing process employed anyway for isolating chips from a wafer assembly is carried out.

Electrical testing of the chips still arranged in the wafer assembly via the conductor path structures of the chip carrier assembly can be carried out prior to isolation of the chip modules from the module assembly, this electrical testing being particularly desirable with respect to effort and associated costs.

A particularly uniform method of pressing together for producing the connection between the chip carrier or the chip carrier assembly and the chip or the wafer is achieved if the pressing together of the chip carrier or the chip carrier assembly and the chip surface or the wafer surface is carried out by means of vacuum. If the sheet is sufficiently rigid in design or if a pull is exerted in the longitudinal direction of the sheet which is stabilised against bending, it may be sufficient to press on the chip carrier merely with the connecting device used for loading the chip carrier or the chip carrier assembly with energy. In this case, the contact pressure required to connect the conductor paths to the chip attachment faces is simultaneously used for pressing the chip carrier or the chip carrier assembly against the chip surface or the wafer surface.

For producing solder bumps on the chip carrier or the chip carrier assembly, which serve for connecting the chip module to a substrate, a board or the like, the external bonding regions of the chip carrier or of the chip carrier assembly can be provided with solder material by a template application process, the carrier layer itself serving as a solder resisting mask in a subsequent reflow process. The solder bump can therefore be produced in a particularly simple manner.

A further method involves providing the external bonding regions with shaped pieces of solder material in an in-line process, the external bonding regions formed by the recesses in the carrier layer serving as positioning receivers for the solder material in this case.

Various processes, of which the common feature is that during backward energy loading of the conductor paths with interposition of the carrier layer the carrier layer remains substantially undamaged and closed, can be employed for the connection between the contact metallizations of the chip or of the wafer and the conductor paths of the chip carrier or of the chip carrier assembly. Soldering processes and thermocompression processes which are carried out by backward energy loading of the conductor paths with laser radiation have proven particularly suitable processes in this connection, the laser radiation being introduced through an optical fibre resting under pressure on the carrier layer at the rear. A further possibility is to employ an ultrasonic process during which an ultrasonic plunger is applied backwardly to the carrier layer and introduces ultrasonic vibrations through the carrier layer compressed in the region of the connecting point into the connecting point between the respective conductor path and the chip attachment face.

BRIEF DESCRIPTION OF THE DRAWINGS

An embodiment of the chip module according to the invention and a possible process for producing such a chip module is described in detail hereinafter with reference to the drawings.

DETAILED DESCRIPTION OF A PREFERRED EMBODIMENT

Figure 1:
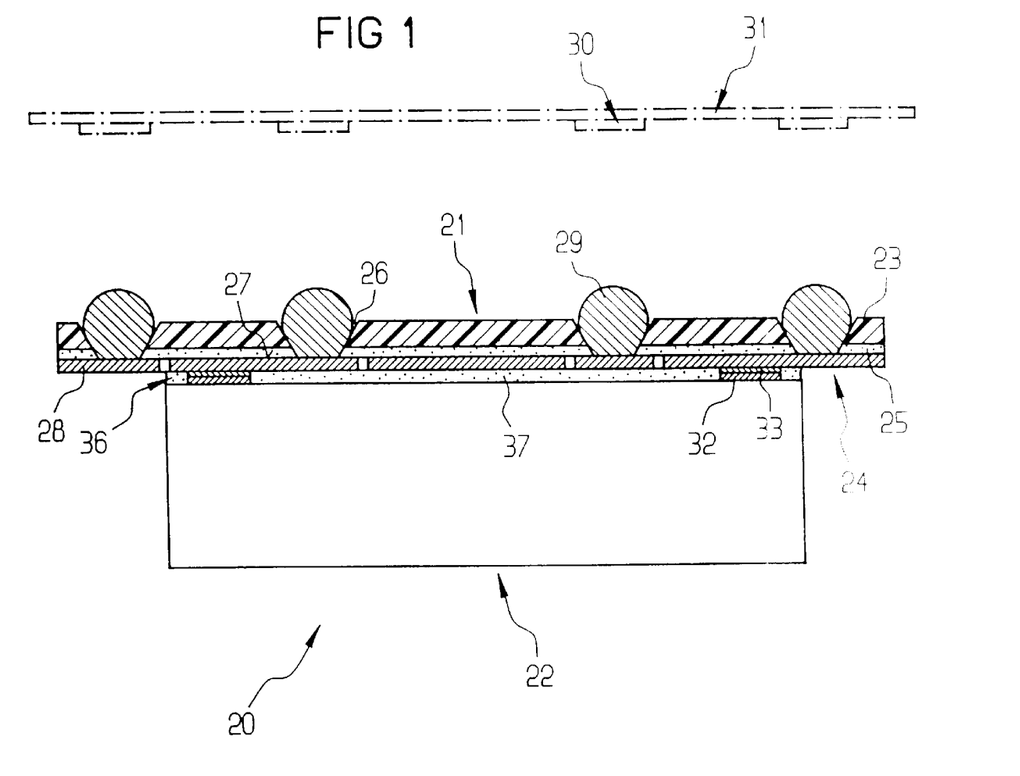
FIG. 1 shows an embodiment of a chip module with a chip carrier bonded on a chip.

FIG. 1 shows a chip module 20 with a chip carrier 21 which is bonded on a chip 22. The chip module 20 shown in FIG. 1 is also described as a chip size package (CSP) since the essential dimensions of the chip module 20 are defined by the chip 22. A ratio of 0.8 to 1.2 between the chip surface and the surface of the chip carrier is generally used to define the size of a CSP in the specialist field.

In the chip module 20 shown in FIG. 1, a chip carrier 21 consisting of a three-layered sheet is used with a carrier layer 23 consisting of polyimide and a bonding layer which is designed as a conductor path structure 24, consists of copper and is connected to the carrier layer 23 via an adhesive layer 25. The carrier layer 23 is provided with recesses 26 extending from the surface of the carrier layer 23 to a rear side 27 of individual conductor paths 28 forming the conductor path structure 24. These recesses 26 form external bonding regions which, with deposits of solder material 29, serve for bonding with attachment faces 30 of a substrate 31 indicated in dot-dash lines in FIG. 1.

FIG. 1 shows, by way of example, two attachment faces 32 from a plurality of chip attachment faces 32 which are arranged peripherally on the chip surface and are provided with contact metallizations 33. The contact metallizations is bonded with respectively allocated conductor paths 28 so "rewiring" of the chip attachment faces 32 arranged peripherally on the chip surface into a flatly distributed attachment face arrangement 34 widened with respect to the spacing between the individual attachment faces takes place on the surface of the chip carrier 21. A filling material 37 with adhesive action which is also described as underfiller in specialist jargon is provided in a gap 36 formed between a chip bonding side 35 and the chip surface for the sealed connection of the chip carrier 21 to the chip 22 and for the mechanical stabilisation of the chip carrier 21 designed as a flexible sheet.

Figure 2:
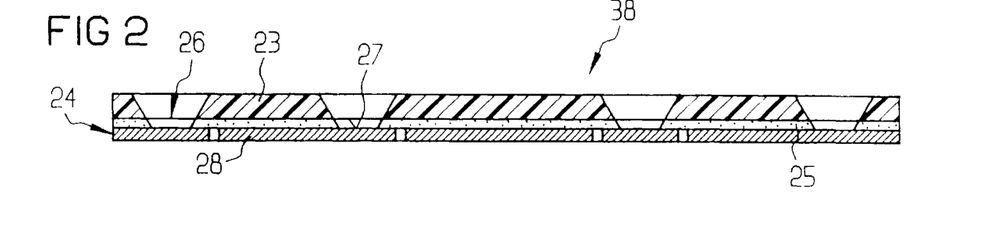
FIGS. 2 to 6 show the construction of a chip carrier.

FIGS. 2 to 6 illustrate the production of the chip carrier 21 used for producing the chip carrier arrangement 20 in FIG. 1 in a chronological sequence. As shown in FIG. 2, the base during production of the chip carrier 21 is a three-layered sheet 38 with an adhesive layer 25 connecting the carrier layer 23 to the conductor path structure 24. In a simplified design, however, it is also possible to provide a design of a chip carrier comparable with the chip carrier 21 on the basis of a sheet in which the conductor path structure is arranged directly on the carrier layer, that is without interposition of an adhesive layer.

The sheet 38 which can be designed as a continuous sheet has in each case the recesses 26 which are provided in the carrier layer 23 and extend to the rear side 27 of the conductor paths 28, wherein the recesses can be produced, for example, by suitable etching processes or also by laser ablation.

Figure 3:
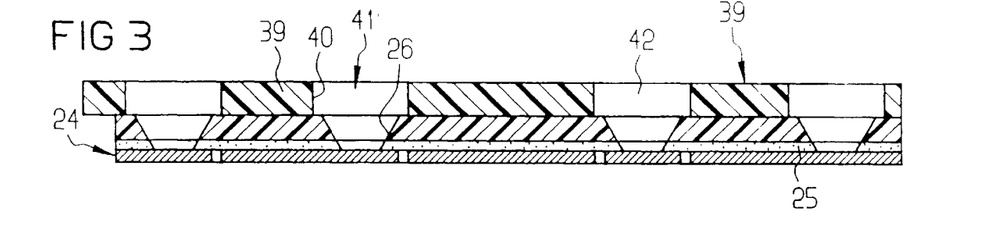

If solder material 42 is to be introduced into the recesses 26 by a template application process to produce the solder material deposit 29 (FIGS. 1 and 6), a template 39 can be placed on the carrier layer 23, as shown in FIG. 3, more specifically such that template orifices 40 provided in the template 39 come to rest congruently with the recesses 26 in the carrier layer 23.

Figure 4:
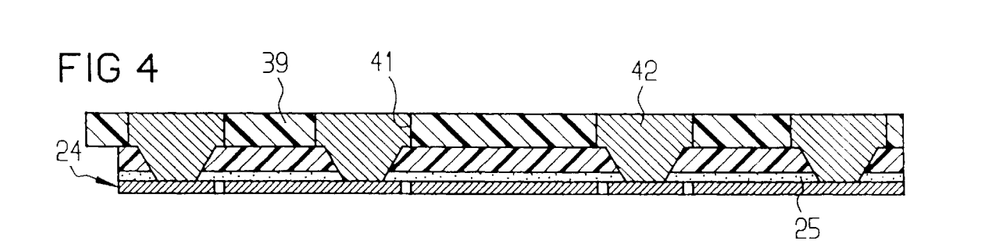

The solder material receivers 41 are filled with solder material 42 in the manner shown in FIG. 4 using a doctor blade or the like, not shown in detail here, after flat application of the solder material 42 on the surface of the template 39 in the solder material receivers 41 formed by superimposed recesses 26 and template orifices 40.

Figure 5:
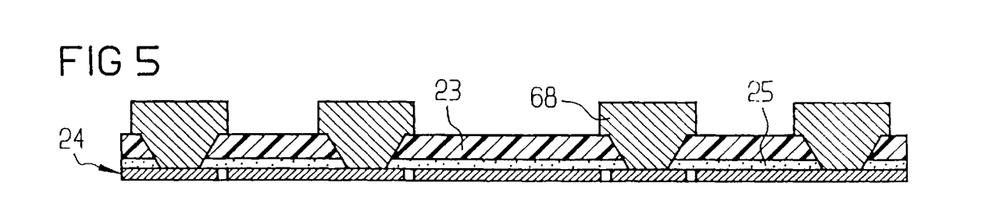
Figure 6:
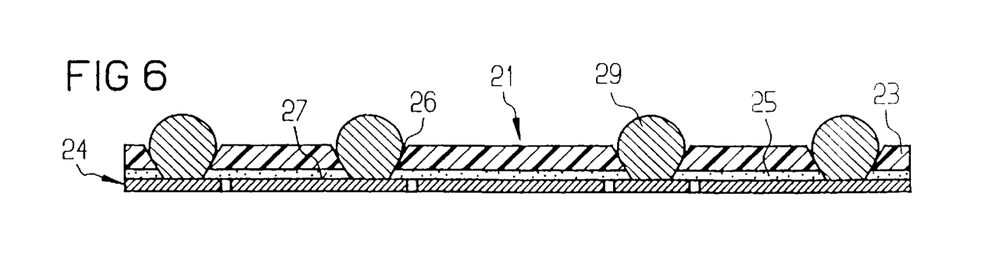

As shown in FIG. 5, quantities of solder material 68 formed, for example, from pasty solder material remain in the recesses 26 after removal of the template 39 from the carrier layer 23. The deposits of solder material 29 shaped in the manner of a meniscus shown in FIG. 6 are then produced by a subsequent reflow process, the carrier layer 23 serving as a solder resisting mask during reflowing.

Figure 7:
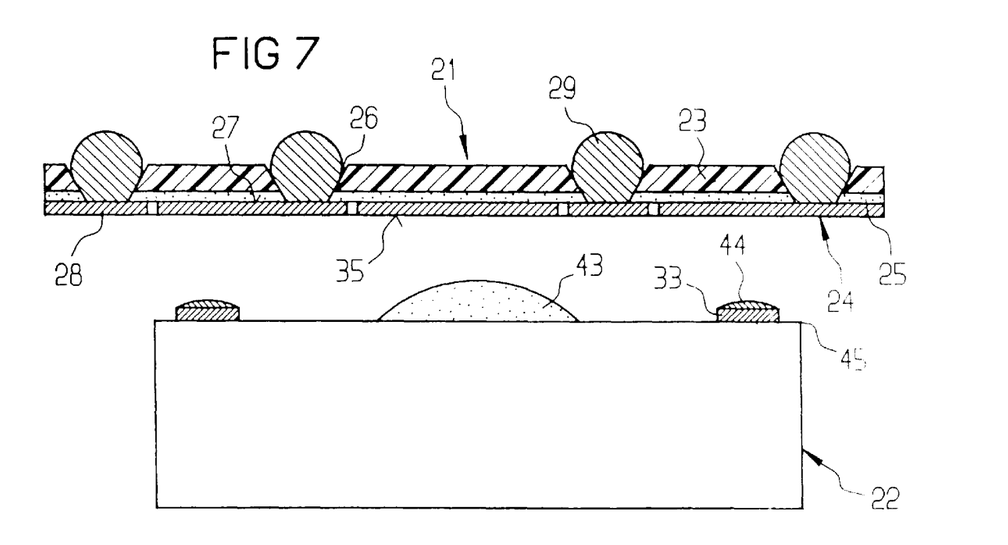
FIG. 7 shows the chip carrier and the chip immediately prior to production of the chip module.

FIG. 7 shows how the chip module 20 illustrated in FIG. 1 is formed on the basis of the chip carrier 21 produced according to the illustrations in FIGS. 2 to 6. For this purpose, there is effected an application of a defined quantity of filling material 43 to the chip surface and a preparation of the chip attachment faces 32 consisting of aluminium in the original state, corresponding to the selected process for connecting the contact metallizations 33 of the chip to the conductor paths 28 of the chip carrier 21. In the present case, the chip attachment faces 32 are provided with contact metallizations 33 designed as nickel bumps with a solder coating 44 consisting of a gold/tin alloy, to enable the bonding of the conductor paths 28 of the chip carrier 21 to the contact metallizations 33 of the chip 22 to be carried out by a soldering process which will be described in detail hereinafter with reference to FIG. 8.

The gold/tin solder coating 44 can be applied by mere immersion of the contact metallizations 33 into an alloy which is correspondingly liquid in design.

For producing the chip module 20 (FIG. 1), that is the rigid mechanical assembly between the chip carrier 21 and the chip 22, the chip carrier 21 is pressed against the surface of the chip 22 so the quantity of filling material 43 applied to the chip surface is displaced outwardly to the periphery of the chip 22 when the gap 36 is formed between the chip bonding side 35 of the chip carrier 21 and the chip surface and is uniformly distributed over the chip surface to the outer edges 45 of the chip 22.

Figure 8:
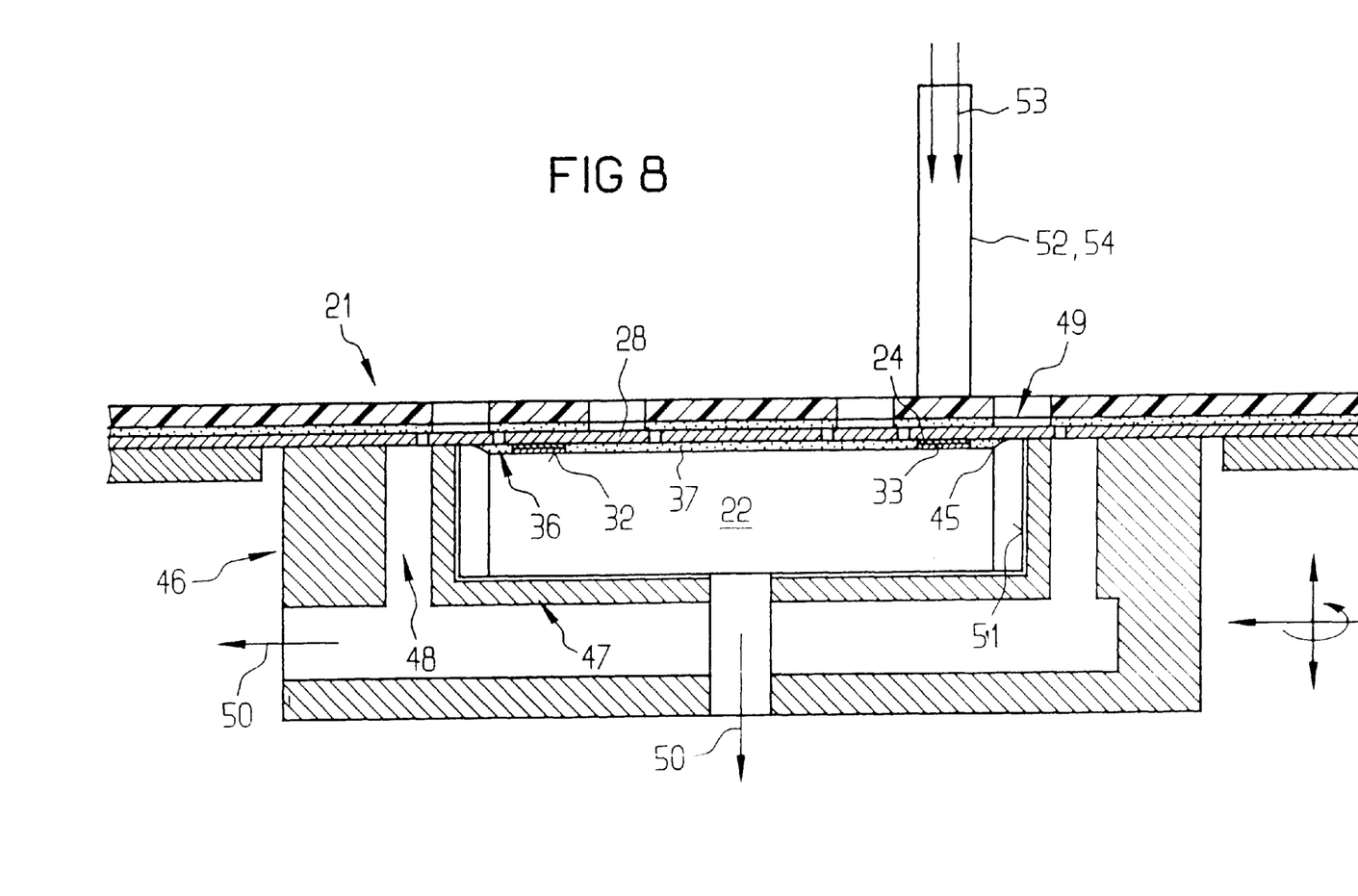
FIG. 8 shows the chip carrier and the chip during production of the connection between the chip carrier and the chip.

FIG. 8 shows that this pressing of the chip carrier 21, which is still located in the continuous sheet assembly in the illustration according to FIG. 8, can be performed by a vacuum device 46 in which the chip 22 is fixed in a chip receiver 47 and the chip carrier 21 is aspirated toward the chip surface by the effect of vacuum (arrow 50) via an annular duct 48 surrounding the chip receiver 47. It can be seen clearly in FIG. 8 that, owing to the capillary effect in the gap 36 between the chip carrier 21 and the chip 22, the filling material 37 is distributed beyond the outer edges 45 of the chip 22 so an additionally supporting effect is produced in the region of a possible projection 49 of the chip carrier 21 beyond the surface of the chip 22.

As also shown in FIG. 8, a vacuum can also be applied for fixing the chip 22 in the chip receiver 47, as indicated by the arrow 50. To prevent adhesion to the internal wall of the chip receiver 47 owing to the discharge of filling material 37 from the gap 36 in the region of the projection 49, the internal wall of the chip receiver 47 is provided with a non-stick coating 51.

As also shown in FIG. 8, the carrier layer 23 of the chip carrier 21 is loaded with laser radiation 53 via an optical fibre 52 with simultaneous application of a contact pressure to connect the conductor paths 28 of the chip carrier 21 to the contact metallizations 33 of the chip 22. The laser radiation 53 penetrates the optically transparent polyimide of the carrier layer 23 or another plastics material, which is optically transparent to laser radiation and is used as carrier layer, and is absorbed in the region of the conductor path 28 so the temperature required for the thermal connection is induced in the region of the connecting point between the conductor path 28 and the associated contact metallizations 33. Filling material 37 possibly arranged between the conductor path 28 and the contact metallizations 33 or the solder coating 24 applied to the contact metallizations 33 is displaced by the contact pressure applied by the optical fibre 52 to the carrier layer 23 so the connection cannot be impaired by filling material 37.

If necessary for achieving a plane surface of the chip carrier 21 applied to the chip 22, a central plunger tool not shown in detail in FIG. 8 can also be used for producing plane support of the chip carrier 21.

In addition to the above-described connection between the conductor paths 28 of the chip carrier 21 and the contact metallizations 33 of the chip 22 by the soldering process, it is also possible to use the connecting means shown in FIG. 8, that is the optical fibre 52 loaded with laser energy, for producing a thermocompression connection, for the preparation of which the contact metallizations 33 designed as nickel bumps is not provided with the solder coating 44 but with a thin gold coating.

According to a further method of producing the connection between the conductor paths 28 of the chip carrier 21 and the contact metallizations 33 or directly to the unprepared aluminium attachment faces 32 of the chip 22, the optical fibre 52 shown in FIG. 8 is replaced by an ultrasonic plunger which is loaded with ultrasound and transmits the ultrasonic vibrations via a compacted region of the carrier layer 23 onto the connecting region between the conductor paths 28 and the respectively allocated chip attachment faces 32.

Figure 9:
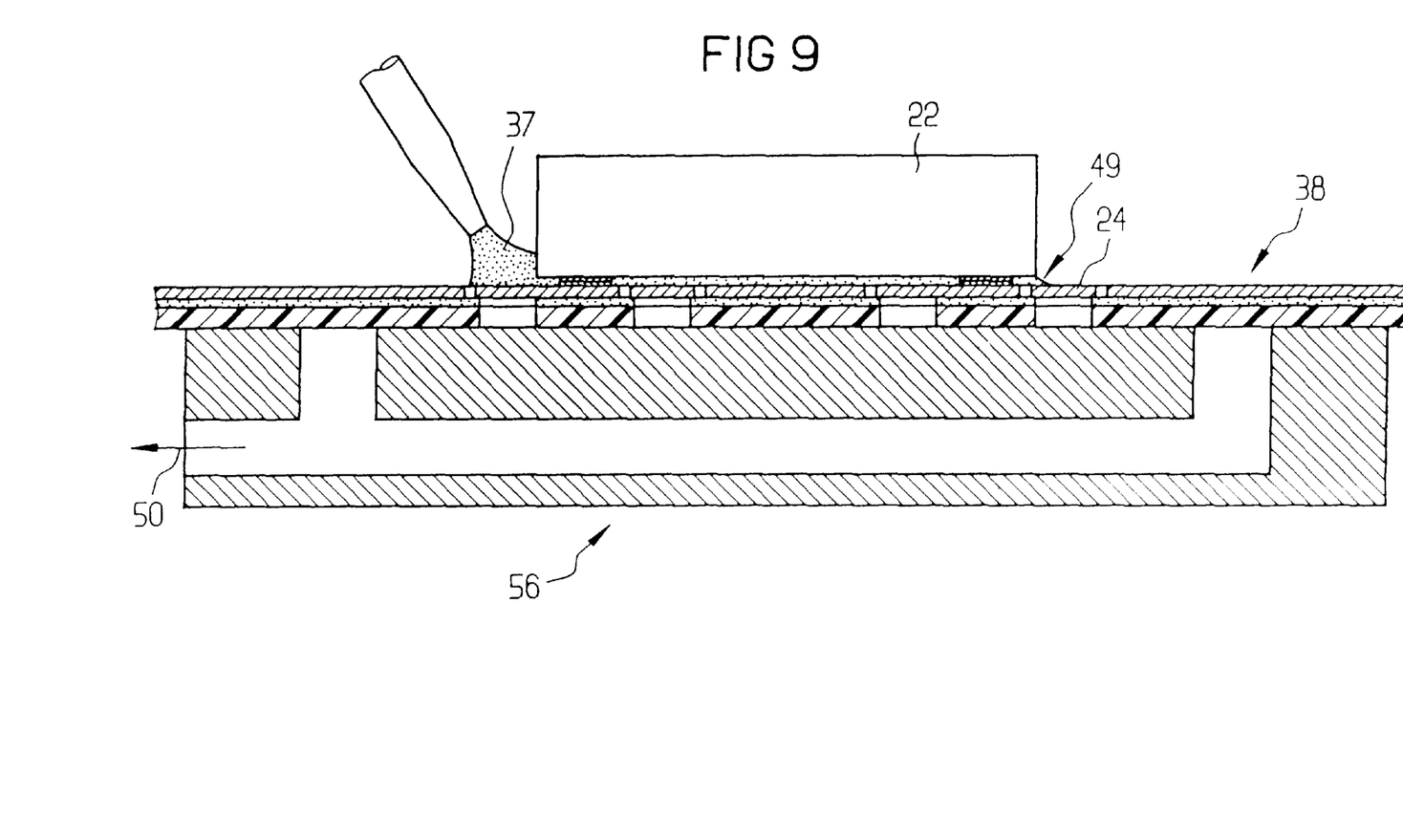
FIG. 9 shows the production of a sealing and supporting frame extending along the periphery of the chip.
Figure 10:
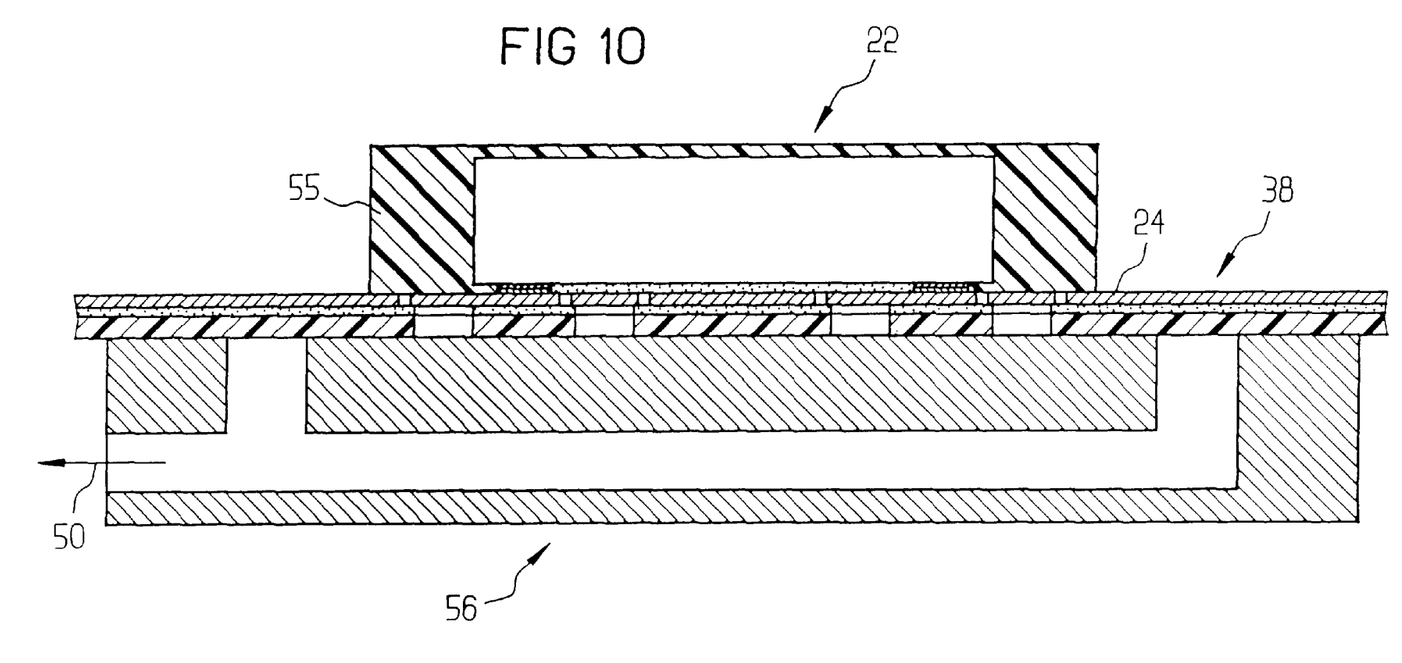
FIG. 10 shows a casting compound enclosing the chip.

FIGS. 9 and 10 show possibilities for mechanical stabilisation of the chip module in addition to the arrangement of the filling material 37 in the gap 36 between the chip carrier 21 and the chip 22 (underfilling). As shown in FIG. 9, additional filling material 37 can be applied for this purpose in the peripheral region along the peripheral edge of the chip 22 in the transition to the chip carrier 21 in order to form a peripheral stabilising frame.

FIG. 10 shows a process known as "moulding" in which the chip is encapsulated with a plastics composition 55.

Figure 11:
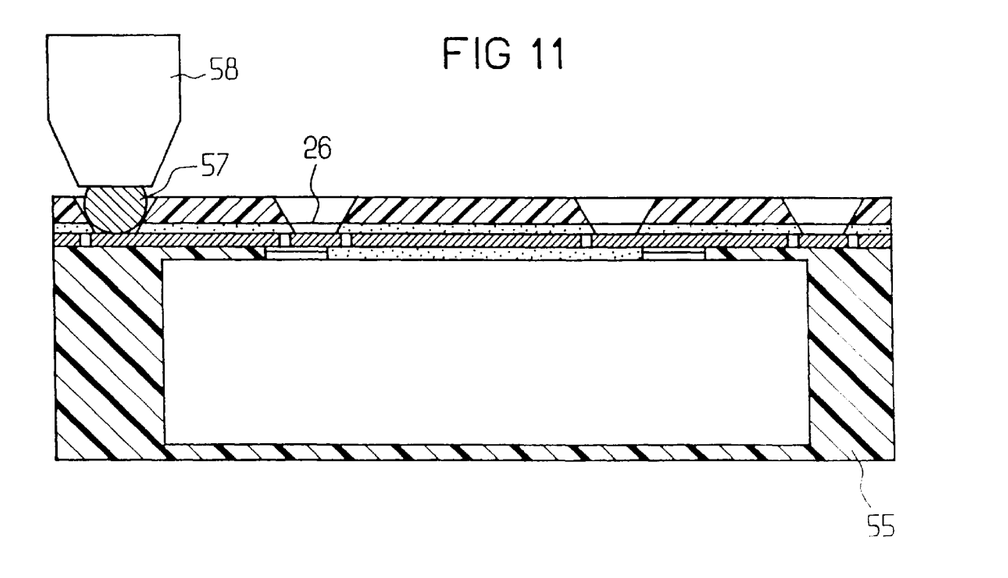
FIG. 11 shows the subsequent application of solder material to the chip carrier.

The plastics composition 55 as well as the filling material 37 additionally applied according to FIG. 9 provide a stabilising support in the region of the projection 49 of the chip carrier 21 beyond the surface of the chip 22. As projecting deposits of solder material 29, as shown in FIG. 1, would prove undesirable in the processes shown in FIGS. 9 and 10 for the additional stabilisation of the chip carrier arrangement, in which the chip carrier sheet 38 is held on a plane face by a vacuum device 56, the deposits 29 of solder material are only produced at a later stage in these cases. For this purpose, as shown in FIG. 11, shaped pieces of solder material 57 can be placed in the recesses 26 before or after separation of the chip carriers 21 connected to the chip 22 from the chip carrier sheet 38 and can then be remelted to form the solder material deposits 29. In the embodiment illustrated in FIG. 11, the shaped pieces of solder material 57 are spherical in shape and are placed in the recesses 26 by a solder bead positioning device 58.

Figure 12:
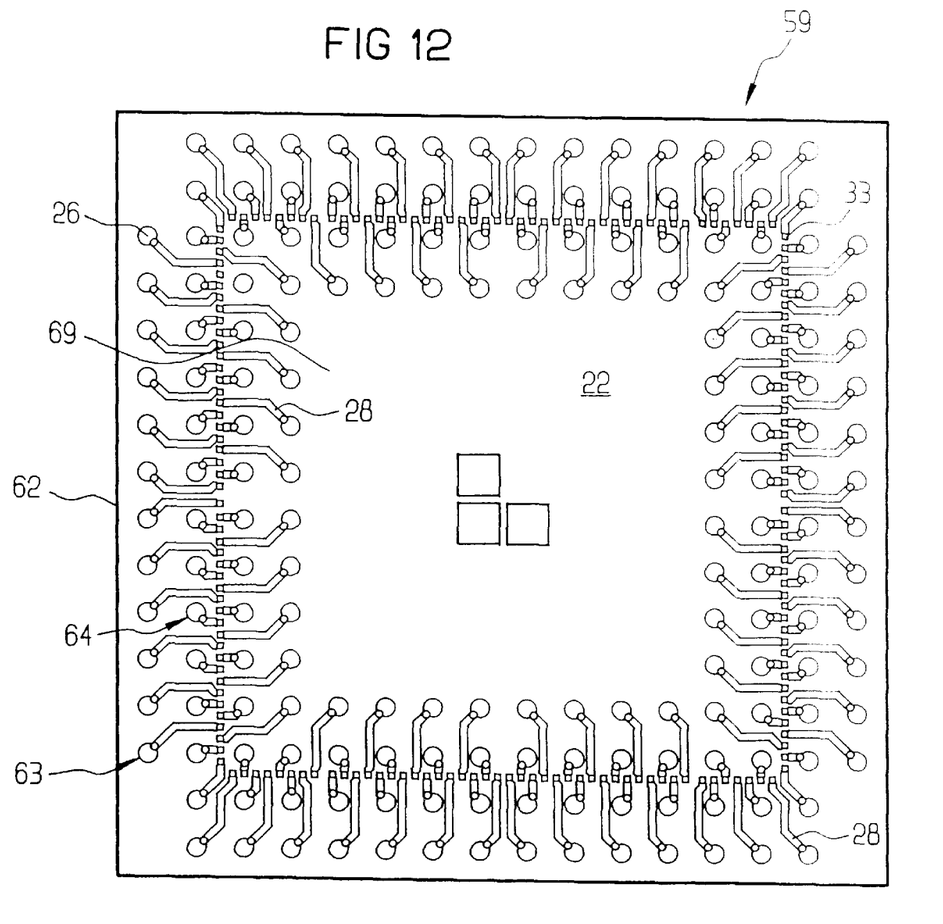
FIGS. 12 to 14 show several examples of flatly distributed attachment face arrangements on the chip carrier of various chip modules.
Figure 13:
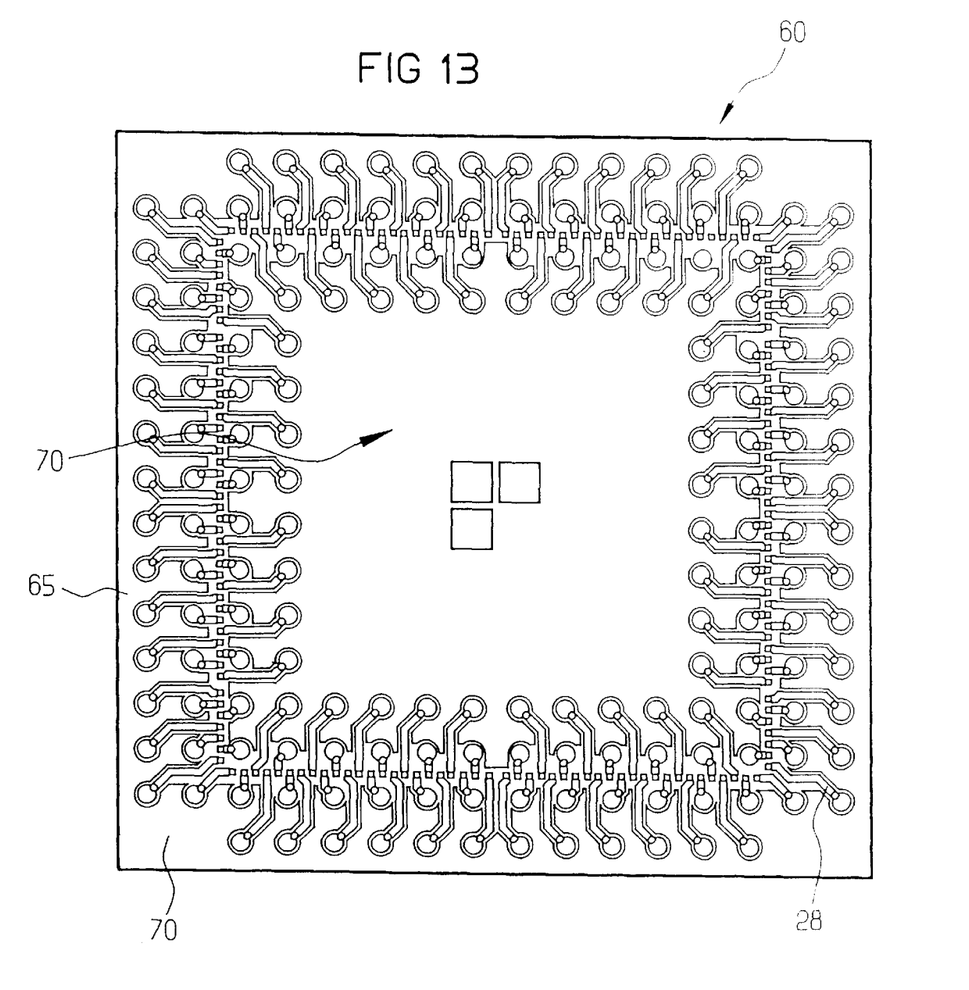
Figure 14:
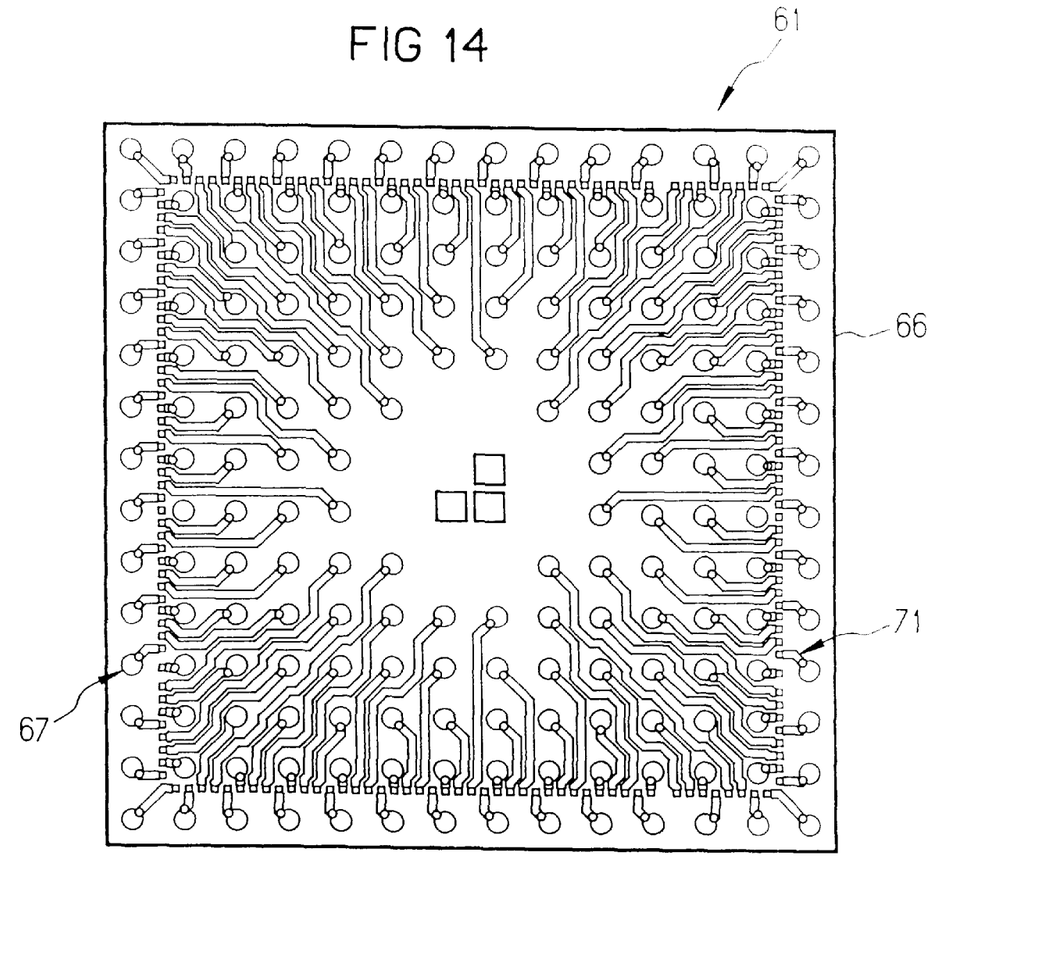

Chip modules 59, 60 and 61 of different designs are shown by way of example in FIGS. 12, 13 and 14 The selected view corresponds roughly to a section between the carrier layer 23 and a respective bonding layer 69, 70, 71 comprising the conductor paths 28. FIG. 12 shows the chip module 59 with a so-called "two-row fan-out" configuration in which a flat redistribution takes place on the basis of the peripheral single-row arrangement of the contact metallizations 33 of the chip 22 over the bonding layer 69, in a chip carrier 62 in which two rows 63, 64 of external bonding regions 26 are arranged outside the periphery of the chip.

FIG. 13 shows a corresponding configuration in which a chip carrier 65 is used, in whose bonding layer 70 not only the conductor paths 28 consist of copper but also the entire bonding layer 70 consists of copper, the conductor path 28 being separated from the remaining copper material by etching. The chip carrier 65 shown by way of example in FIG. 13 is therefore distinguished by particularly high rigidity.

Finally, FIG. 14 shows a chip carrier 66 with a so-called single-row fan-out configuration in which only one row 67 of external bonding regions 26 is arranged outside the periphery of the chip and all other external bonding regions 26 are distributed within the periphery of the chip.

Figure 15:
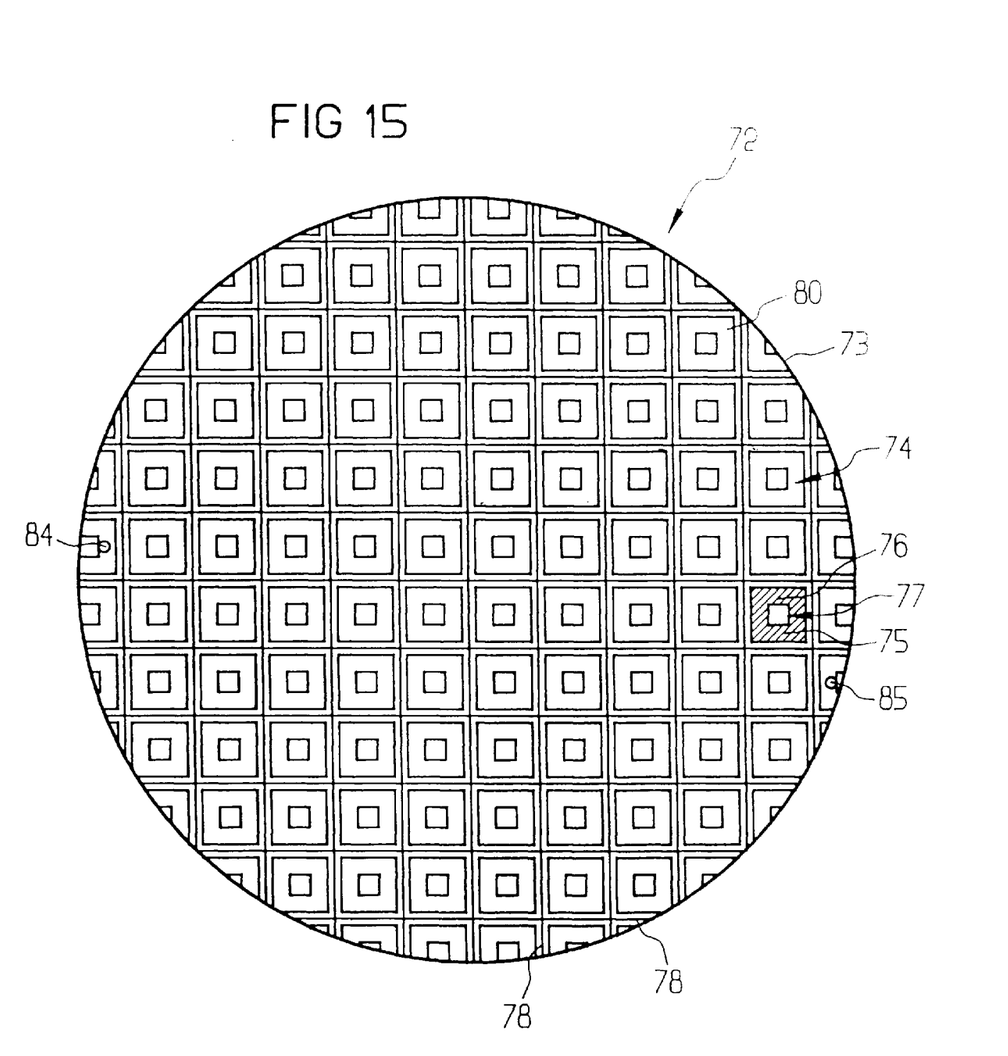
FIG. 15 shows a module assembly consisting of a wafer and a chip carrier assembly arranged thereon in a plan view.

FIG. 15 shows a module assembly 72 with a wafer 73 and a chip carrier assembly 74, arranged on the wafer 73, with a plurality of chip carriers 76 arranged coherently on the common carrier layer 23. As can be inferred from the illustration in FIG. 15, the wafer has a plurality of coherently formed chips 75 which are allocated a respective chip carrier 76 from the chip carrier assembly 74. For the isolation, following production of the module assembly 72 shown in FIG. 15, of chip modules 77 which are formed respectively of a chip 75 and a chip carrier 76 in the present case, parting grooves 78 are provided on the wafer 73, along the course of which the module assembly 72 can be isolated into the chip modules 77 by sawing or other suitable parting processes.

In one embodiment, the chip modules 77 isolated from the module assembly 72 can coincide with respect to their design substantially with the chip module 20 shown in FIG. 1, with the difference that the chip carrier 76, in contrast to the chip carrier 21 shown in FIG. 1, extends with its outer edges substantially flush with the lateral edges of the chip and does not project laterally beyond it, as shown in FIG. 1.

Figure 16:
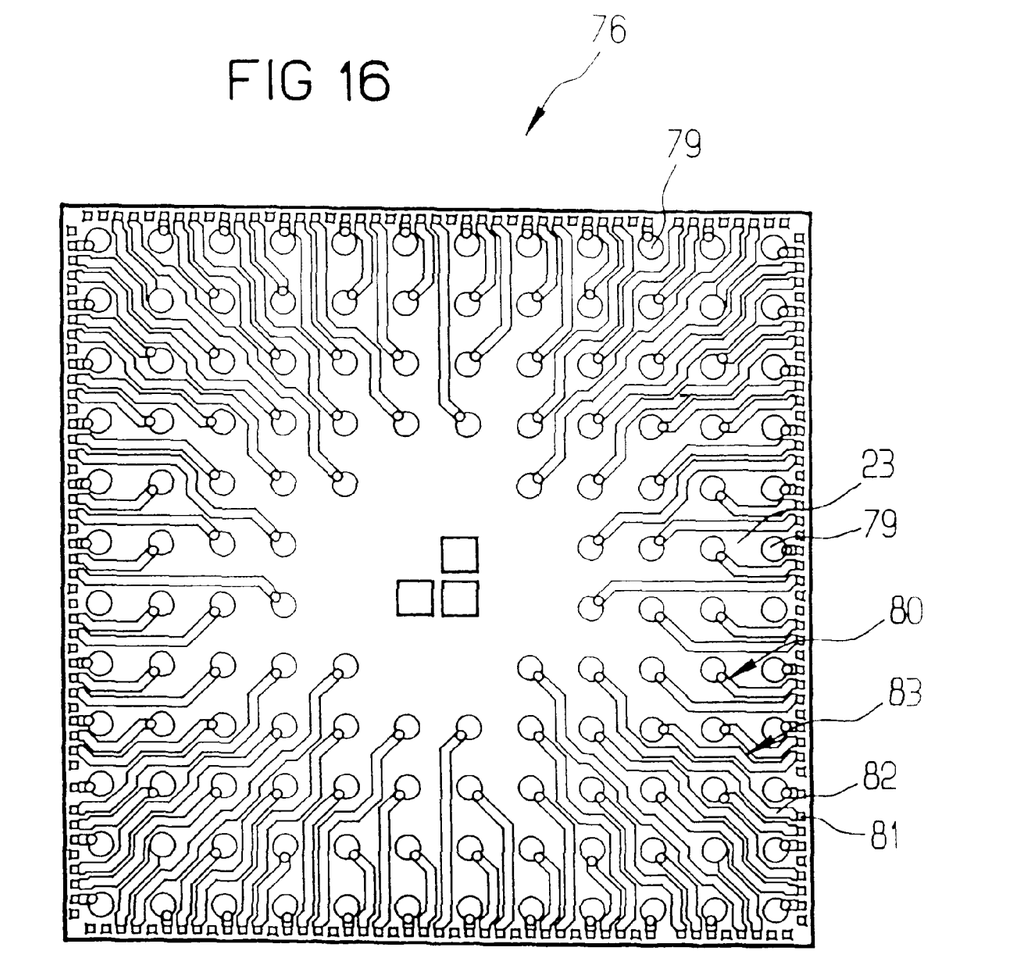
FIG. 16 shows an enlarged detail of a chip carrier from the chip carrier assembly shown in FIG. 15.

A chip carrier 76 of this type is shown in a plan view in FIG. 16 and, on the basis of the chip bonding regions 81, allows a so-called fan-in distribution of attachment faces 79 of an attachment face arrangement 80 on the carrier layer 23 of the chip carrier 76. The attachment face arrangement 80 of the chip carrier 76 is shown in simplified form in FIG. 15 by a frame-like hatched line.

Apart from the above-mentioned difference from the construction of the chip module 20 shown in FIG. 1 in that a design of the chip carrier 76 which is substantially flush with the chip surface is required for producing a chip module 77, all process steps shown in FIGS. 2 to 7 can be carried out for producing the module assembly shown in FIG. 15 with the difference that a plurality of chips 75 formed coherently in the wafer 73 can be used instead of an individual chip 22 and a plurality of chip carriers 76 formed coherently in the chip carrier assembly 74 can be used instead of an individual chip carrier 21. Chip modules 77 are therefore produced by isolating the chip modules 77 from a module assembly 72 previously produced, for example, by the process steps shown in FIGS. 2 to 7.

In order to prevent the formation of air inclusions between the chip carrier assembly and the surface of the wafer 73 if the chip carrier assembly 74 is applied to the wafer 73 over a large area—for example as shown in FIG. 7 with respect to the production of the individual chip module 20—, the chip carrier assembly can be provided with parting lines not shown in detail in FIG. 15 and designed as lines of perforations which are congruent with the parting lines 78 of the wafer 73, split the individual chip carriers 76 from one another and simultaneously allow the escape of air through the perforations to prevent the above-mentioned inclusions of air.

To allow correct relative positioning of the chip carrier assembly 74 with respect to the wafer 73 with corresponding overlapping layers shown in FIG. 15 between the individual chip carriers 76 and the chips 75 which allow bonding between the chip bonding regions 81 at the ends of conductor paths 82 of conductor path structures 83 allocated to the individual chip carriers 76, the wafer 73 can be provided, on its surface, with positioning pins 84, 85 which engage in correspondingly designed positioning orifices, not shown in detail here, in the carrier layer 23 of the chip carrier assembly 74. The positioning pins 84, 85 can be formed by raised bumps in the edge region of the wafer 73 of incompletely formed chips. Like the other bumps of the functional chips 75 not shown in detail here, the bumps of the wafer can basically be produced by, for example, autocatalytic deposition of material or immersion soldering.

FIGS. 17 to 20 show the production, differing from that in FIGS. 2 to 7, of the assembly between a chip and a chip carrier or a wafer and a chip carrier assembly by the example of the connection between a chip attachment face 86 and a conductor path 82 of a chip carrier 76. As will be described hereinafter, the construction of the connection shown in FIGS. 17 to 20 allows particularly inexpensive production of chip modules 77 on the wafer plane (FIG. 15).

Figure 17:
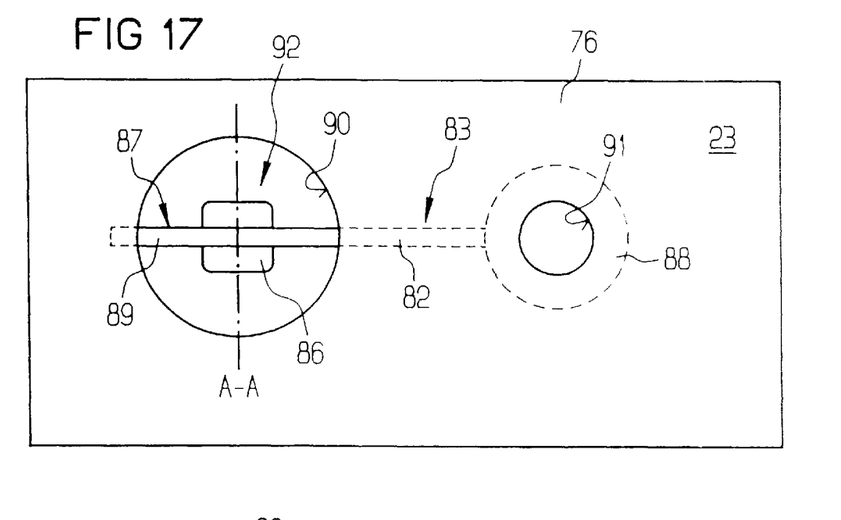
FIG. 17 shows a detail of a connecting construction between an external attachment face of a chip carrier and a chip attachment face of a chip in a plan view.
Figure 18:
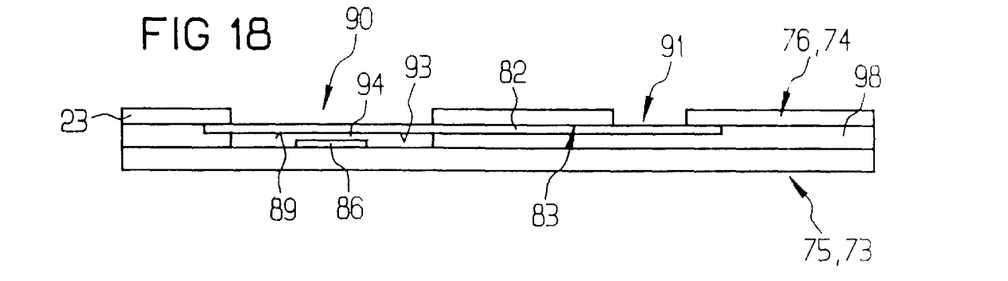
FIG. 18 shows the connecting construction illustrated in FIG. 17 in a side view prior to application of connecting material.

As shown by the plan view of a cut out region of the chip carrier 76 in FIG. 17 compared with the corresponding side view in FIG. 18, the chip carrier 76 in the present case consists of the carrier layer 23 with a conductor path structure 83 which is arranged on the underside thereof and of which only one conductor path 82 is shown here. The conductor path 82 is composed in the present case of a rod conductor 87 and a circular flat conductor 88. The conductor path 82 is arranged on the underside of the carrier layer 23 such that a chip bonding region 89 of the rod conductor 87 and the circular flat conductor 88 of the conductor track 82 are located beneath an orifice 90 or a recess 91 in the carrier layer 23. The recess 91 is limited at the bottom by the rear of the circular flat conductor 88 of the conductor path 82. The orifice 90 in the carrier layer 23 extends to the rear of the rod conductor 87 of the conductor path 82 and also exposes an ambient region 92 which surrounds the chip bonding region 89 of the rod conductor 87 and, as shown in FIG. 17, extends beyond the chip attachment face 86.

As shown in FIG. 18, an adhesive layer 98 provided for producing the assembly between the chip carrier assembly 74 and the wafer 73 is arranged such that a connecting face 93 substantially congruent with the face of the orifice 90 is formed on the surface of the wafer 73 or of the chip 75 in whose internal region the chip attachment face 86 is arranged. FIG. 18 also shows that a bonding gap 94 is formed between the surface of the chip attachment face 86 and the underside of the rod conductor 87 of the conductor path 82.

Figure 19:
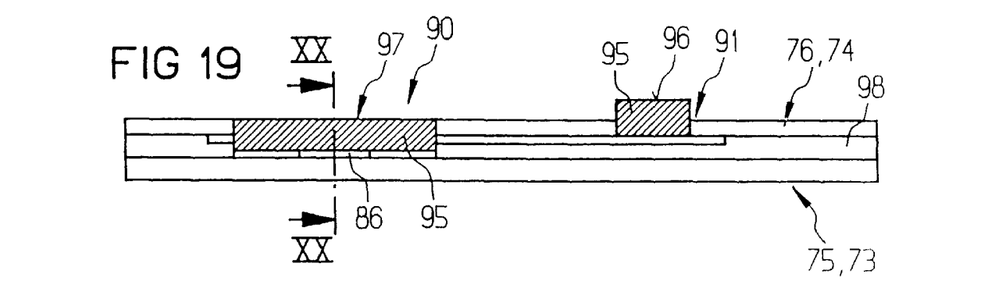
FIG. 19 is an illustration of the connecting construction corresponding to the view in FIG. 18 after application of connecting material.
Figure 20:
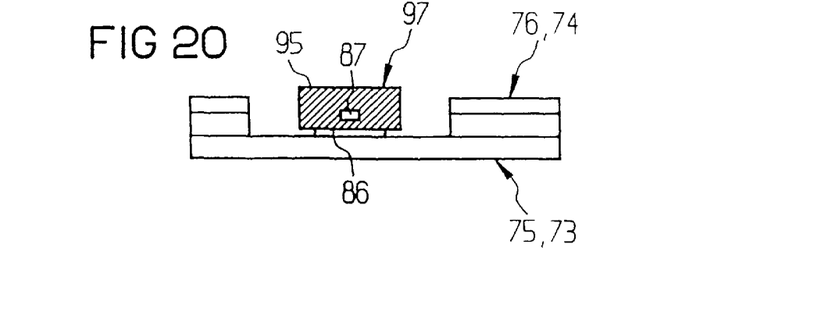
FIG. 20 is a sectional view of the connection between a conductor path of the chip carrier and the chip attachment face along section line XX—XX in FIG. 19.

FIG. 19 shows the recess 91 in the chip carrier 76 of the chip carrier assembly 74 and the orifice 90 in the chip carrier 76 extending to the surface of the wafer 73 in the ambient region 92 after introduction of a connecting material 95. The orifice 90 in the region of the chip attachment face 86 and of the chip bonding region 89 of the conductor path 82 and the bonding gap 94 are filled with the connecting material 95 so, as shown in the sectional view in FIG. 20, the conductor path 82 is completely enclosed in the chip bonding region 89 with a secure connection to the chip attachment face 86. This complete enclosure is a result of the all-round growth of the connecting material 95 during the deposition process. An increase in the bonding gap 94 is also produced.

A particular advantage of the connecting construction shown in FIGS. 17 to 20 is that both the recess 91 and the orifice 90 in the chip carrier 76 can be filled with connecting material 95 in one and the same process step so, on the one hand, external bonding bumps 96 are created for the external attachment face arrangement 80 of the chip carrier 76 and, on the other hand, internal connections 97 between the wafer 73 or the chips 75 formed coherently thereby and the chip carriers 76 are created.

The orifices 90 in the chip carrier assembly 74 are sufficiently great so the chip attachment faces 86 of the wafer 73 can be cleaned prior to introduction of connecting material 95, which can be effected, for example, by autocatalytic deposition of nickel or the like, and/or can be provided with a coating, for example zincate or an intermediate nickel layer.

The connecting material can be introduced particularly advantageously by immersion of the wafer 73 or guidance of the wafer 73 into or through a bath of material.

In contrast to the rod-shaped geometry of the conductor path 82 shown in FIGS. 17 to 20 in the region of the orifice 90, other conductor path geometries are also possible which promote and utilise the above-described growth of the connecting material in a particular manner during the deposition process to form the connection between the chip attachment 86 and the conductor path 82. The conductor path 82 can therefore have an annularly designed chip bonding region of which the internal diameter is dimensioned such that the connecting material construction on the chip attachment face 86 grows through the ring so to speak owing to the deposition process and thus contributes to the formation of the connection. The annularly designed chip bonding region can be covered by the edge of the orifice 90 or can be exposed. In particular in the case of an annular chip bonding region covered by the edge of the orifice 90 in the carrier layer 23, a surface of the internal connection formed substantially flush with the surface of the chip carrier 76 or the chip carrier assembly 74 can be achieved without special measures being required for this purpose. The orifice 90 can basically be greater or smaller than the chip attachment face but can also be equally great.

Other methods of influencing the formation of the surface of the internal connection by the design of the conductor path 82 in its chip bonding region 89 via the geometry of the conductor path 82 involve making the conductor path 82 square in the form of a frame, slit-shaped or even cross-shaped in this region.

What is claimed is:

1. A chip module including at least one chip with attachment faces, comprising:

a chip carrier forming a sheet and connected to said at least one chip by a filling material interposed therebetween, said chip carrier comprises:

a carrier layer made of a plastic material, said carrier layer having a chip bonding side facing said chip and external bonding regions defined by recesses in said carrier layer extending therethrough, said carrier layer extending over a region of the attachment faces of said chip; and a plurality of conductor paths, each of said plural conductor paths having a front side connected to one of the attachment faces of said chip and a rear side abutting one of the external bonding regions for forming a substantially flat distributed attachment face arrangement for connection of said chip module to one of an electronic component and a substrate, said plural conductor paths being substantially planar on the chip bonding side of said carrier layer.

2. A chip module according to claim 1, wherein the carrier layer is closed in a region of the attachment faces.

3. A chip module according to claim 1, wherein the carrier layer has, in an overlap region with the attachment faces of said chip, orifices which extend toward the rear side of said plural conductor paths and receive connecting material electrically connecting said plural conductor paths to the associated attachment faces.

4. A chip module according to claim 3, wherein said plural conductor paths are arranged in a region of the orifices so as to only partially overlap the attachment faces of said chip with a chip bonding region.

5. A chip module according to claim 1, further comprising a supporting frame extending along a periphery of said chip.

6. A chip module according to claim 1, further comprising a casting compound connecting lateral faces of said chip to a projection of said chip carrier, said projection protruding beyond a surface of said chip.

7. A chip module according to claim 1, wherein the external bonding regions include a solder material having a melting point lower than a temperature required for thermal connection between a bonding face metal plating of said chip and said plural conductor paths of said chip carrier.

8. A chin module assembly with a chip carrier assembly and a chip assembly with a plurality of coherently formed chip modules, according to claim 1.

9. A chip module according to claim 3, wherein said plural conductor paths are arranged adjacent to the associated attachment faces.

10. A module assembly according to claim 8, wherein said chip assembly is a wafer.

11. A chip module including at least one chip with attachment faces, comprising:

a chip carrier forming a sheet and connected to said at least one chip by a filling material interposed therebetween, said chip carrier comprises:

a carrier layer made of a plastic material, said carrier layer having a chip bonding side facing said chip and external bonding regions defined by recesses in said carrier layer extending therethrough, said carrier layer extending over a region of the attachment faces of said chip; and a plurality of conductor paths, each of said plural conductor paths having a front side connected to one of the attachment faces of said chip and a rear side abutting one of the external bonding regions for forming a substantially flat distributed attachment face arrangement for connection of said chip module to one of an electronic component and a substrate, said plural conductor paths being substantially planar on the chip bonding side of said carrier layer, the rear side of the conductor path structure and a top surface of said chip defining a gap therebetween filled with the filling material to form a sealed connection between said chip carrier and said chip.

* * * * *